United States Patent
Beppu

(10) Patent No.: US 11,201,594 B2
(45) Date of Patent: Dec. 14, 2021

(54) CASCODE AMPLIFIER CIRCUIT

(71) Applicant: Murata Manufacturing Co., Ltd., Kyoto (JP)

(72) Inventor: Nobuyasu Beppu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 37 days.

(21) Appl. No.: 16/784,494

(22) Filed: Feb. 7, 2020

(65) Prior Publication Data
US 2020/0177135 A1    Jun. 4, 2020

Related U.S. Application Data

(63) Continuation of application No. PCT/JP2018/029797, filed on Aug. 8, 2018.

(30) Foreign Application Priority Data

Aug. 10, 2017    (JP) .............................. JP2017-156173

(51) Int. Cl.
| | |
|---|---|
| *H03F 1/22* | (2006.01) |
| *H03F 1/02* | (2006.01) |
| *H03F 1/34* | (2006.01) |
| *H03F 3/195* | (2006.01) |

(52) U.S. Cl.
CPC ........... *H03F 1/223* (2013.01); *H03F 1/0211* (2013.01); *H03F 1/342* (2013.01); *H03F 3/195* (2013.01); *H03F 2200/129* (2013.01); *H03F 2200/21* (2013.01); *H03F 2200/294* (2013.01); *H03F 2200/451* (2013.01)

(58) Field of Classification Search
CPC ............... H03F 1/22; H03F 1/223; H03F 3/72
USPC .................................................. 330/311, 51
See application file for complete search history.

(56) References Cited

U.S. PATENT DOCUMENTS

| | | | |
|---|---|---|---|
| 6,028,487 A * | 2/2000 | Kakuta | .................. H03F 1/223 |
| | | | 330/311 |
| 2002/0079971 A1 | 6/2002 | Vathulya | |
| 2007/0046379 A1 | 3/2007 | Tanahashi et al. | |
| 2011/0221531 A1* | 9/2011 | Kim | ..................... H03G 1/0029 |
| | | | 330/284 |

(Continued)

FOREIGN PATENT DOCUMENTS

| | | |
|---|---|---|
| JP | 2004-516737 A | 6/2004 |
| JP | 2007-060458 A | 3/2007 |

(Continued)

OTHER PUBLICATIONS

International Search Report for PCT/JP2018/029797 dated Sep. 11, 2018.
Written Opinion for PCT/JP2018/029797 dated Sep. 11, 2018.

*Primary Examiner* — Steven J Mottola
(74) *Attorney, Agent, or Firm* — Pearne & Gordon LLP

(57) ABSTRACT

An amplifier circuit is a cascade amplifier circuit that includes a first transistor circuit including a signal input portion to which a signal is input from outside; a load circuit connected between the first transistor circuit and a power-supply line; and a second transistor cascode-connected between the load circuit and the first transistor circuit. The first transistor circuit is constituted by a plurality of transistors connected in parallel, and a bias circuit is provided that selectively supplies a bias voltage to the plurality of transistors.

19 Claims, 4 Drawing Sheets

(56) References Cited

U.S. PATENT DOCUMENTS

2018/0026592 A1\* 1/2018 Wallis .................. H04B 1/1607
330/302

FOREIGN PATENT DOCUMENTS

| JP | 2010-239401 A | 10/2010 |
| JP | 2013-236410 A | 11/2013 |

\* cited by examiner

CASCODE AMPLIFIER CIRCUIT

This is a continuation of International Application No. PCT/JP2018/029797 filed on Aug. 8, 2018 which claims priority from Japanese Patent Application No. 2017-156173 filed on Aug. 10, 2017. The contents of these applications are incorporated herein by reference in their entireties.

BACKGROUND

Technical Field

The present disclosure relates to a cascode amplifier circuit used, for example, for a low noise amplifier.

A low noise amplifier (hereinafter referred to as "LNA"), for example, for mobile phone terminals is intended to amplify a signal taken in from an antenna. For example, Patent Document 1 discloses a cascode amplifier circuit in which low noise and high gain can be obtained.

Patent Document 1: Japanese Unexamined Patent Application Publication No. 2007-60458

BRIEF SUMMARY

In an amplifier circuit disclosed in Patent Document 1, a bias state of a first-stage FET is arranged constantly. Hence, when a "gain switching function", which switches gain of the amplifier circuit in accordance with a strength of a voltage of the signal taken in from antenna, is implemented, high linearity is not expected to be achieved when gain is reduced, and low noise performance is not also expected to be achieved when gain is increased.

Thus, the present disclosure aims to provide an amplifier circuit that provides both low noise performance and linearity that correspond to the strength of an input signal.

A cascode amplifier circuit according to the present disclosure includes a first transistor circuit to which a signal is input and that comprises a plurality of transistors connected in parallel; a load circuit connected between the first transistor circuit and a power-supply line; at least one second transistors cascode-connected between the load circuit and the first transistor circuit; and a bias circuit configured to selectively supply a bias voltage to the plurality of transistors of the first transistor circuit.

In the above-described configuration, when the first transistor circuit and the second transistor (or the second transistors) are cascode-connected, the amplifier circuit is provided that achieves high gain with low current consumption, and, when a bias voltage is selectively supplied to the plurality of transistors, an effective transistor size of the first transistor circuit changes, and a predetermined gain and linearity are thus obtained.

More specifically, in a state in which all the above-described plurality of transistors are turned on, that is, in a state in which high gain is necessary (gain importance mode), no additional parasitic capacitance is added to the transistors, and thus a NF is sufficiently obtained. In a state in which at least one of the plurality of transistors is turned off, that is, in a state in which high linearity is necessary (linearity importance mode), input signal strength is high, a high NF is thus not demanded, and the above-described parasitic capacitance is not an issue.

Thus, in the present disclosure, when the transistors are connected in parallel and "gain importance mode" and "linearity importance mode" are switched, "low distortion characteristics" can be obtained while obtaining "low noise and a predetermined gain".

Incidentally, it is desirable that the plurality of transistors include transistors that are different in gate width size from each other. Thus, with a small number of transistors, the effective transistor size of the first transistor circuit can be set at multiple levels, and characteristic setting ranges of gain and linearity can be easily increased.

Furthermore, in the transistors that are different in gate width size from each other, when a ratio of gate width sizes of the respective transistors is a ratio of powers of two, the effective transistor size of the first transistor circuit can be set at multiple levels in spite of a small number of transistors, and characteristic setting ranges of gain and linearity can be easily increased.

Furthermore, it is desirable that the bias circuit, the first transistor circuit, and the single or a plurality of second transistor be constituted in or on a single die. Thus, the amplifier circuit with the bias circuit is completed with the single die, thereby enabling a reduction in the size of the amplifier circuit.

In the present disclosure, the amplifier circuit having a predetermined gain and linearity is obtained under low current consumption and high gain characteristics.

DETAILED DESCRIPTION

Figure 1:
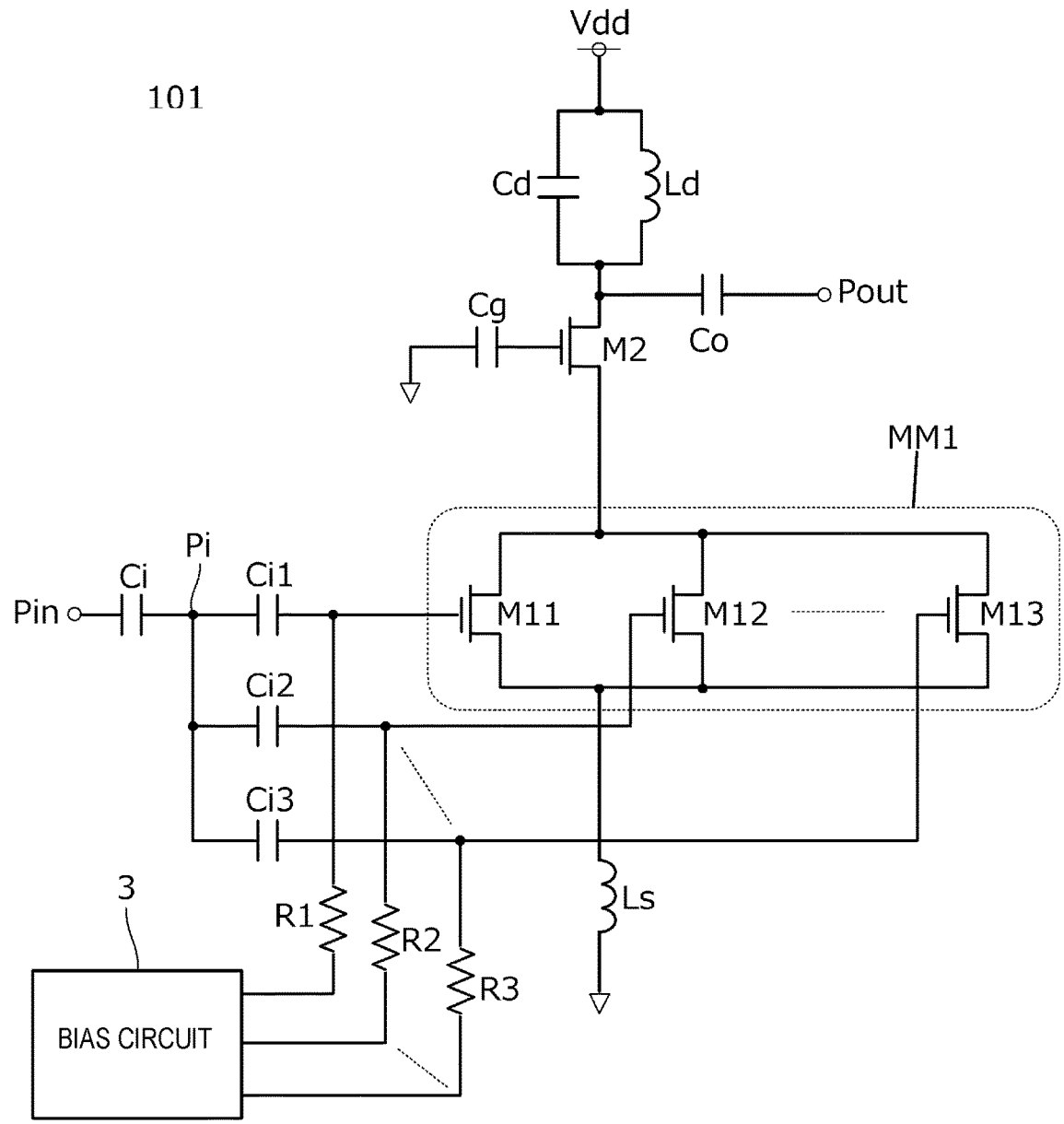
FIG. 1 is a circuit diagram of an amplifier circuit 101 according to a first embodiment.

A plurality of embodiments for implementing the present disclosure will be described below by giving some specific examples with reference to figures. In the figures, the same elements are denoted by the same reference numerals. In consideration of ease of description or understanding of main points, the embodiments will be separately described for the sake of convenience. However, configurations described in different embodiments can be partially replaced or combined. In second and subsequent embodiments, a description of things in common with a first embodiment is omitted, and only respects in which the second and subsequent embodiments differ from the first embodiment will be described. In particular, similar function effects achieved by similar configurations are not repeatedly described in each embodiment.

First Embodiment

FIG. 1 is a circuit diagram of an amplifier circuit 101 according to the first embodiment. The amplifier circuit 101 is a cascode amplifier circuit that includes a first transistor circuit MM1 including a signal input portion Pi to which a signal is input from outside, a load circuit connected between the first transistor circuit MM1 and a power-supply line Vdd, and a second transistor (MOS-FET) M2 cascode-connected between the load circuit and the first transistor circuit MM1. The above-described load circuit is constituted by a parallel circuit including a load inductor Ld and a capacitor Cd.

A gate of the second transistor M2 is grounded through a capacitor Cg. An inductor (feedback inductor) Ls is connected between a source of the first transistor circuit MM1 and the ground. A capacitor Ci is connected between a signal input terminal Pin of the amplifier circuit 101 and the signal input portion Pi. Furthermore, a capacitor Co is connected between a connection point between the load circuit and the second transistor M2 and a signal output terminal Pout of the amplifier circuit 101.

The first transistor circuit MM1 is constituted by a plurality of transistors (MOS-FET) M11, M12, . . . , and M13 connected in parallel. Gates of the transistors M11, M12, and M13 are respectively connected to the signal input portion Pi through capacitors Ci1, Ci2, and Ci3. Furthermore, the gates of the transistors M11, M12, and M13 are respectively connected to a bias circuit 3 through resistors R1, R2, and R3.

The amplifier circuit 101 is used, for example, as a first-stage LNA of a reception circuit that performs cellular communications.

The bias circuit 3 applies a bias voltage to the gates of the transistors M11, M12, and M13 so that the transistors M11, M12, and M13 selectively enter an Active state/Inactive state. For example, if each of the transistors M11, M12, and M13 is an enhancement-mode n-type MOS-FET, the Inactive state is entered when a gate voltage Vg=0, and the Active state is entered when a predetermined positive voltage is applied to the gate. A transistor in the Inactive state is in cutoff, resulting in a substantial open circuit between a drain and a source.

In the above-described configuration, when a bias voltage is selectively supplied to the plurality of transistors M11, M12, . . . , and M13, the number of transistors connected in parallel can be switched. Thus, when an effective transistor size (equivalent size) of the first transistor circuit MM1 is changed, gain and linearity can be determined. In other words, in the case where an input signal is small and gain is more necessary than linearity (the case of gain importance), among the plurality of transistors M11, M12, . . . , and M13, the number of transistors to be operated is increased. In the case where an input signal is large and linearity is more necessary than gain (the case of linearity importance), among the plurality of transistors M11, M12, . . . , and M13, the number of transistors to be operated is reduced.

In a state in which high gain is necessary (gain importance mode), when all the plurality of transistor M11, M12, . . . , and M13 are turned on, high gain is not only achieved, but an NF is also sufficiently obtained because an additional circuit that causes a deterioration in characteristics does not exist around a transistor in an ON state. In other words, it is made easier to provide both low noise performance and linearity. Furthermore, in a state in which high linearity is necessary (linearity importance mode), one or some of the plurality of transistor M11, M12, . . . , and M13 enter an off state, and parasitic capacitance is therefore added to the gate or gates, thereby resulting in deterioration in NF. In this "linearity importance mode", however, input signal strength is in a high state, a high NF is thus not demanded, and the deterioration in NF is not an issue. In other words, it is made easier to provide both low noise performance and linearity.

In comparison with a configuration in which circuits are merely switched, such as a configuration in which a plurality of transistors constituting the first transistor circuit MM1 are connected in parallel and in which a switch transistor is provided that selectively inputs a signal to gates of these transistors, in this embodiment, NF improvement effects can be expected, and both low noise performance and linearity that correspond to the strength of an input signal can be provided.

Second Embodiment

In a second embodiment, an amplifier circuit will be described in which a configuration of the first transistor circuit differs from that in the first embodiment.

Figure 2:
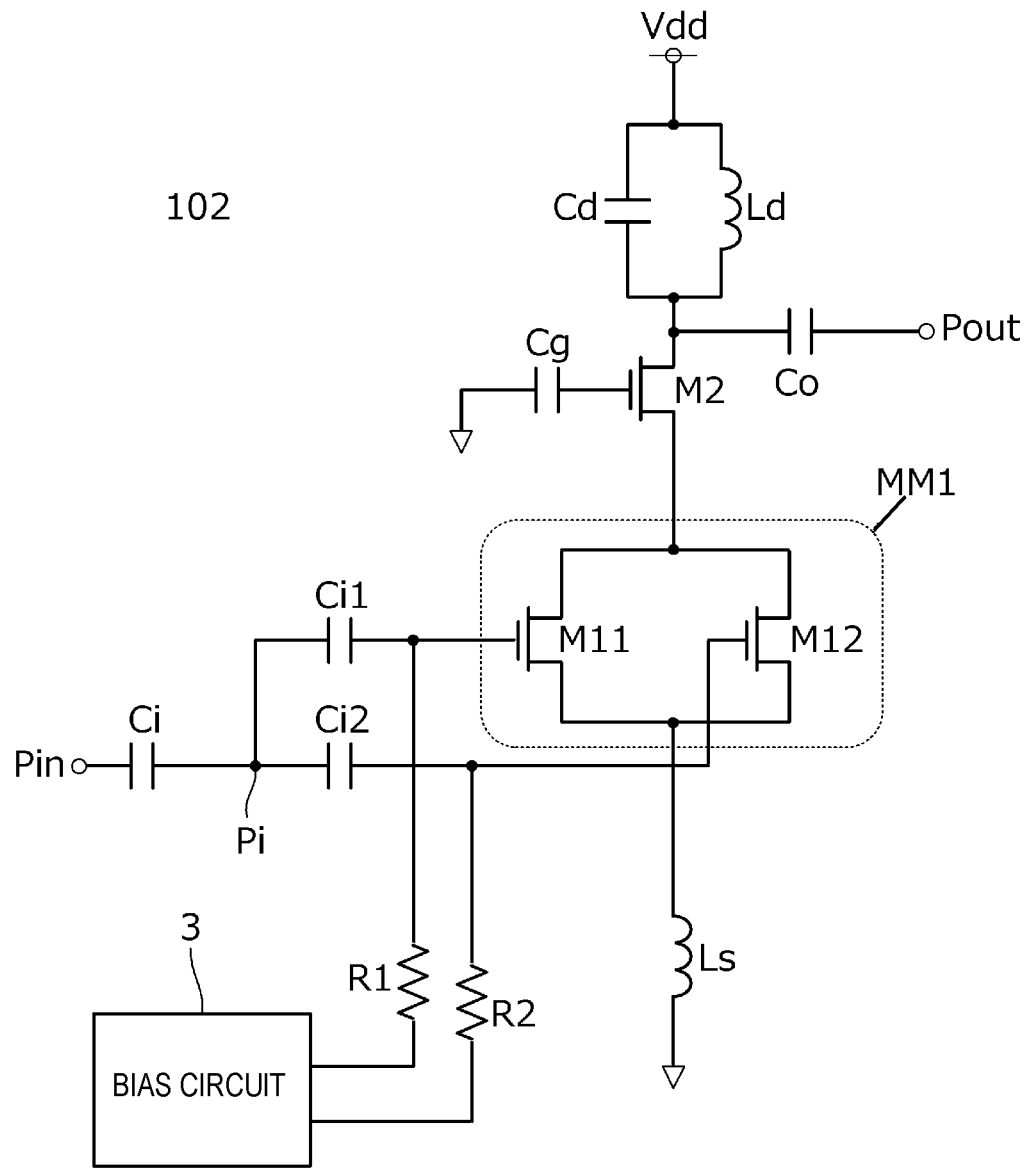
FIG. 2 is a circuit diagram of an amplifier circuit 102 according to a second embodiment.

FIG. 2 is a circuit diagram of an amplifier circuit 102 according to the second embodiment. The amplifier circuit 102 differs from the amplifier circuit 101 illustrated in FIG. 1 in the configuration of the first transistor circuit MM1. In the amplifier circuit 102 illustrated in FIG. 2, the first transistor circuit MM1 is constituted by the transistors M11 and M12 that are different in gate width. A gate width ratio of the transistor M11 to the transistor M12 is 1:2. In the bias circuit 3, states of the application of a bias voltage to the transistors M11 and M12 can be set to any of four states (a power-of-two number of states), and the effective transistor size of the first transistor circuit can be set at four sizes (two squared sizes). For this reason, the effective transistor size of the first transistor circuit can be set at multiple levels in spite of a small number of transistors, and characteristic setting ranges of gain and linearity can be easily increased. In other words, in the case where an input signal is small and gain is more necessary than linearity, the effective transistor size of the first transistor circuit MM1 is increased. In the case where an input signal is large and linearity is more necessary than gain, the effective transistor size of the first transistor circuit MM1 is reduced.

Figure 3:
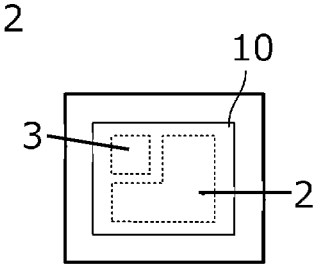
FIG. 3 is a plan view illustrating an internal structure of a chip of the amplifier circuit 102.

FIG. 3 is a plan view illustrating an internal structure of a chip of the amplifier circuit 102. In the chip, a die 10 is provided. In or on this die 10, the bias circuit 3 illustrated in FIG. 2 and the other portion (a main portion of the amplifier circuit 102) are constituted.

When the bias circuit 3 is constituted in or on a single die together with the first transistor circuit MM1, the second transistor M2, and so forth as just described, the amplifier circuit with the bias circuit is completed with the single die, thereby enabling a reduction in the size of the amplifier circuit.

Incidentally, the first transistor circuit MM1 may be constituted by three or more transistors. In this case, as long as a relationship of gate widths is $2^0:2^1:2^2:2^3: \ldots$, that is, as long as a ratio of powers of two is set, the effective transistor size of the first transistor circuit can be set at more multiple levels in spite of a small number of transistors, and characteristic setting ranges of gain and linearity can be easily increased.

Third Embodiment

In a third embodiment, an example of an amplifier circuit including a feedback circuit for controlling gain and linearity will be described.

Figure 4:
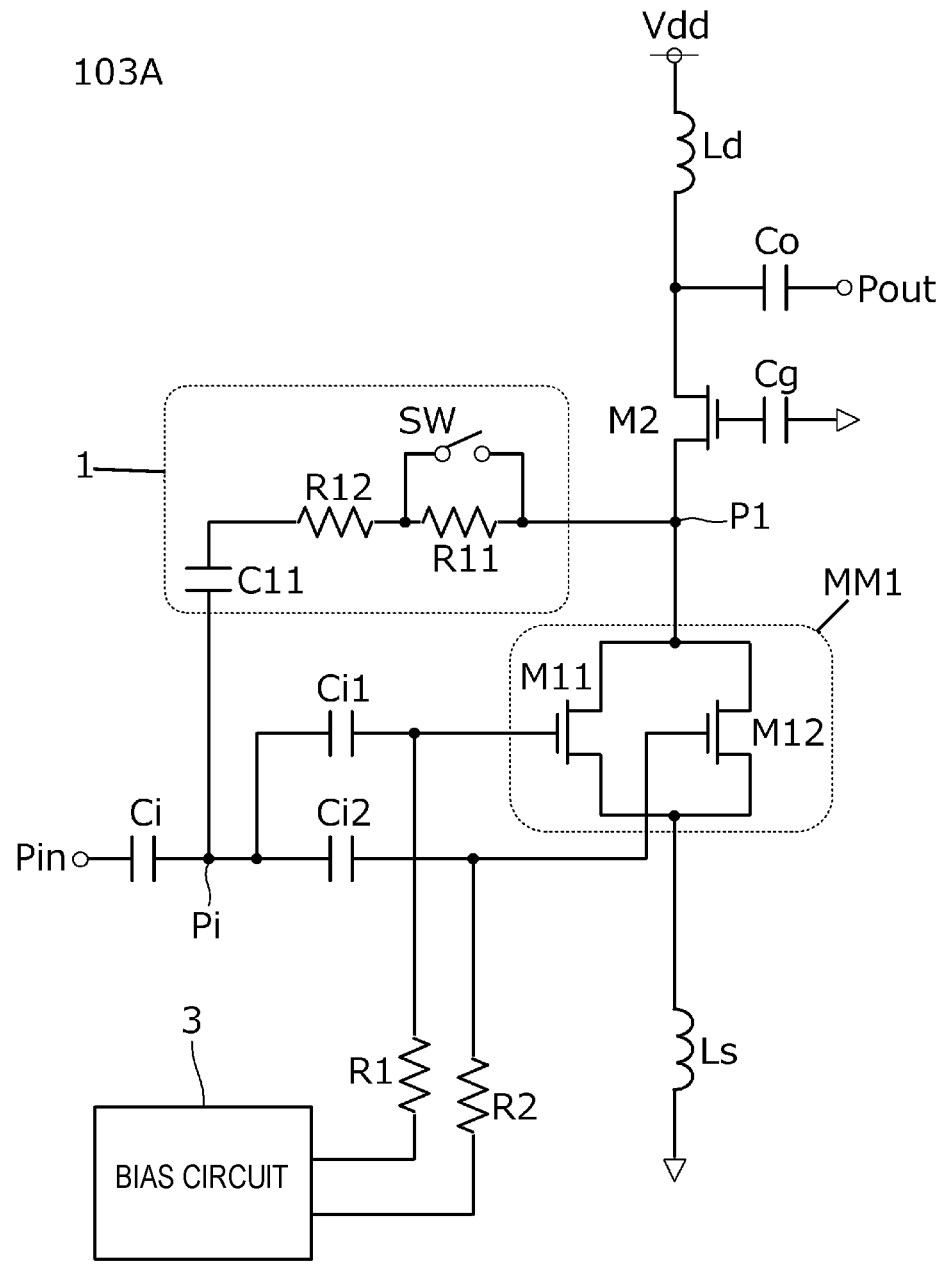
FIG. 4 is a circuit diagram of an amplifier circuit 103A according to a third embodiment.

FIG. 4 is a circuit diagram of an amplifier circuit 103A according to the third embodiment. In the amplifier circuit 103A, the load inductor Ld is a load circuit. A feedback circuit 1 is connected between a connection portion P1 (a drain of the first transistor circuit MM1) between the load inductor Ld and the first transistor circuit MM1 and the signal input portion Pi of the first transistor circuit MM1.

The feedback circuit 1 is constituted by resistors R11 and R12, a capacitor C11, and a switch SW. The other configuration is as illustrated in FIG. 2.

In the above-described configuration, the amount of feedback can be determined from a state of the switch SW of the feedback circuit 1, and thus gain and linearity can be changed. In other words, when both end portions of the resistor R11 are short-circuited by turning on the switch SW to increase the amount of feedback, gain is reduced, and linearity increases. When the resistor R11 is inserted by turning off the switch SW to reduce the amount of feedback, linearity decreases, but gain increases.

Figure 5:
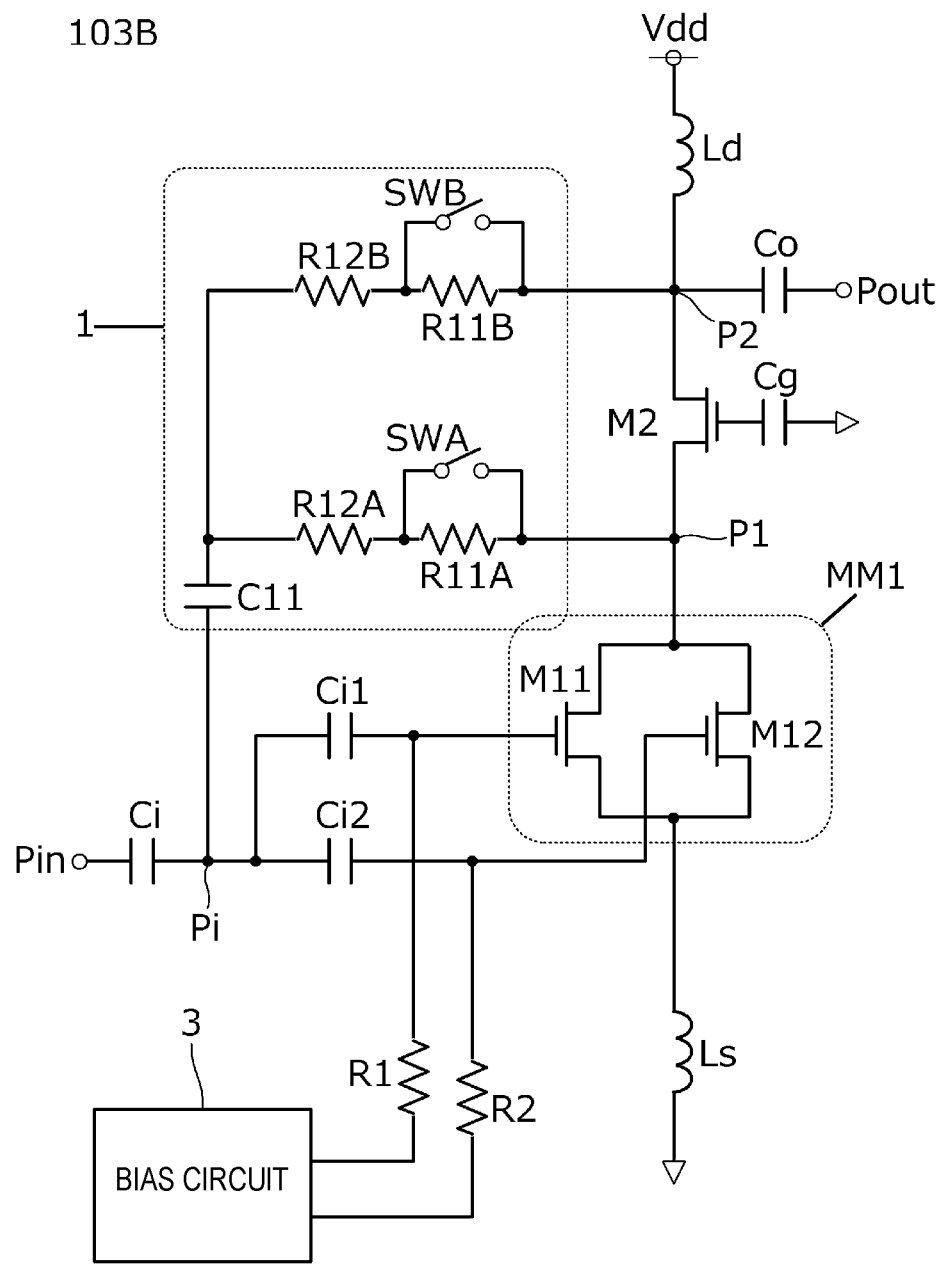
FIG. 5 is a circuit diagram of another amplifier circuit 103B according to the third embodiment.

FIG. 5 is a circuit diagram of another amplifier circuit 103B according to the third embodiment. The amplifier circuit 103B differs from the example illustrated in FIG. 4 in a configuration of the feedback circuit 1. The feedback circuit 1 is constituted by resistors R11A, R12A, R11B, and R12B, the capacitor C11, and switches SWA and SWB. A feedback circuit constituted by the resistors R11A, R12A, the switch SWA, and the capacitor C11 is connected between the connection portion P1 (the drain of the first transistor circuit MM1) between the first transistor circuit MM1 and the second transistor M2 and the signal input portion Pi of the first transistor circuit MM1. Furthermore, a feedback circuit constituted by the resistors R11B, R12B, the switch SWB, and the capacitor C11 is connected between a connection portion P2 (a drain of the second transistor M2) between the load inductor Ld and the second transistor M2 and the signal input portion Pi.

Thus, there may be provided the feedback circuit 1 connected between a plurality of portions (P1, P2) between the load inductor Ld and the first transistor circuit MM1 and the signal input portion Pi.

In this embodiment, when not only the effective transistor size (effective gate width) of the first transistor circuit MM1 but also the amount of feedback of the feedback circuit 1 is controlled, a predetermined gain and linearity are obtained. Furthermore, when control of the effective transistor size of the first transistor circuit MM1 and control of the amount of feedback are combined, setting ranges of gain and linearity can be increased.

In each embodiment described above, although the configuration is provided in which gate bias voltages of a plurality of transistors constituting the first transistor circuit MM1 are controlled, the circuit may be configured so that, among the plurality of transistors, certain transistors are selectively connected in parallel through a switch.

Furthermore, in each embodiment described above, although the example is given where the cascode amplifier circuit is constituted by cascode-connecting the single second transistor M2, the second transistor M2 may be constituted by a plurality of transistors connected in series. If a plurality of second transistors are provided, output impedance can be adjusted. This facilitates impedance matching to a subsequent-stage circuit. Furthermore, current consumption can also be adjusted.

Furthermore, if a plurality of second transistors are provided, a feedback circuit may be connected between a connection point between second transistors and the signal input portion Pi of the first transistor circuit MM1.

Finally, descriptions of the above-described embodiments are illustrative and not restrictive in any respect. Modifications and changes may be made as appropriate by those skilled in the art. The scope of the present disclosure is defined not by the above-described embodiments but by the claims. Furthermore, the scope of the present disclosure includes changes made to the embodiments within a scope equivalent to the claims.

REFERENCE SIGNS LIST

C11 capacitor
Cd capacitor
Cg capacitor
Ci, Ci1, Ci2, Ci3 capacitor
Co capacitor
Ld load inductor
MM1 first transistor circuit
M11, M12, M13 transistor
M2 second transistor
P1, P2 connection portion
Pi signal input portion
Pin signal input terminal
Pout signal output terminal
R1, R2, R3 resistor
R11, R12 resistor
R11A, R12A, R11B, R12B resistor
SW, SWA, SWB switch
Vdd power-supply line
1 feedback circuit
3 bias circuit
10 die
101, 102, 103A, 103B amplifier circuit

The invention claimed is:

1. A cascode amplifier circuit comprising:
a first transistor circuit to which a signal is input and that comprises a plurality of transistors connected in parallel;
a load circuit connected between the first transistor circuit and a power-supply line;
at least one second transistor cascode-connected between the load circuit and the first transistor circuit;
a bias circuit configured to selectively supply a bias voltage to the plurality of transistors of the first transistor circuit;
a plurality of first capacitors, each of the plurality of first capacitors connected to a respective one of the plurality of transistors of the first transistor circuit; and
a second capacitor connected in series with the plurality of first capacitors.

2. The cascode amplifier circuit according to claim 1, wherein, when the bias circuit is in a first state, the bias circuit is configured to supply the bias voltage such that all the plurality of transistors of the first transistor circuit are turned on.

3. The cascode amplifier circuit according to claim 1, wherein, when the bias circuit is in a second state, the bias circuit is configured to supply the bias voltage such that at least one of the plurality of transistors of the first transistor circuit is turned off.

4. The cascode amplifier circuit according to claim 2, wherein, when the bias circuit is in a second state, the bias circuit is configured to supply the bias voltage such that at least one of the plurality of transistors of the first transistor circuit is turned off.

5. The cascode amplifier circuit according to claim 1, wherein the plurality of transistors of the first transistor circuit comprise transistors having different gate width sizes.

6. The cascode amplifier circuit according to claim 2, wherein the plurality of transistors of the first transistor circuit comprise transistors having different gate width sizes.

7. The cascode amplifier circuit according to claim 3, wherein the plurality of transistors of the first transistor circuit comprise transistors having different gate width sizes.

8. The cascode amplifier circuit according to claim 5, wherein, for two of the transistors having different gate width sizes, a ratio of the gate width sizes for the two transistors is a ratio of powers of two.

9. The cascode amplifier circuit according to claim 6, wherein, for two of the transistors having different gate width sizes, a ratio of the gate width sizes for the two transistors is a ratio of powers of two.

10. The cascode amplifier circuit according to claim 7, wherein, for two of the transistors having different gate width sizes, a ratio of the gate width sizes for the two transistors is a ratio of powers of two.

11. The cascode amplifier circuit according to claim 1, wherein the bias circuit, the first transistor circuit, and the at least one second transistor are constituted in or on a single die.

12. The cascode amplifier circuit according to claim 2, wherein the bias circuit, the first transistor circuit, and the at least one second transistor are constituted in or on a single die.

13. The cascode amplifier circuit according to claim 3, wherein the bias circuit, the first transistor circuit, and the at least one second transistor are constituted in or on a single die.

14. The cascode amplifier circuit according to claim 5, wherein the bias circuit, the first transistor circuit, and the at least one second transistor are constituted in or on a single die.

15. The cascode amplifier circuit according to claim 8, wherein the bias circuit, the first transistor circuit, and the at least one second transistor are constituted in or on a single die.

16. The cascode amplifier circuit according to claim 1, comprising a plurality of second transistors cascode-connected between the load circuit and the first transistor circuit.

17. The cascode amplifier circuit according to claim 1, further comprising a feedback circuit connected to a node between the at least one second transistor and the first transistor circuit, and to a node between an input of the cascode amplifier and an input of the first transistor circuit.

18. The cascode amplifier circuit according to claim 17, wherein the feedback circuit is further connected to a node between the load circuit and the at least one second transistor.

19. The cascode amplifier circuit according to claim 1, wherein the bias circuit is configured to:
 increase a linearity of the first transistor circuit by supplying the bias voltage to a first transistor of the plurality of transistors, but not to a second transistor of the plurality of transistors; and
 increase a gain of the first transistor circuit by supplying the bias voltage to both the first transistor and the second transistor of the plurality of transistors.

* * * * *